United States Patent
Zhang et al.

(10) Patent No.: US 11,335,625 B2
(45) Date of Patent: May 17, 2022

(54) VIA HOLE STRUCTURE, MANUFACTURING METHOD THEREOF, ELECTRONIC DEVICE, AND DISPLAY DEVICE

(71) Applicants: Mianyang BOE Optoelectronics Technology Co., Ltd., Sichuan (CN); BOE Technology Group Co., Ltd., Beijing (CN)

(72) Inventors: Lei Zhang, Beijing (CN); Daqing Sun, Beijing (CN); Wei Qiu, Beijing (CN); Fangliang Yan, Beijing (CN)

(73) Assignees: Mianyang BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 31 days.

(21) Appl. No.: 16/771,261

(22) PCT Filed: Dec. 16, 2019

(86) PCT No.: PCT/CN2019/125656
§ 371 (c)(1),
(2) Date: Jun. 10, 2020

(87) PCT Pub. No.: WO2020/155893
PCT Pub. Date: Aug. 6, 2020

(65) Prior Publication Data
US 2021/0225738 A1 Jul. 22, 2021

(30) Foreign Application Priority Data
Jan. 31, 2019 (CN) .......................... 201910098927.6

(51) Int. Cl.
*H01L 23/52* (2006.01)
*H01L 23/48* (2006.01)
(Continued)

(52) U.S. Cl.
CPC .......... *H01L 23/481* (2013.01); *G06F 3/0412* (2013.01); *H01L 21/486* (2013.01); *H01L 21/76816* (2013.01)

(58) Field of Classification Search
CPC .................. H01L 23/481; H01L 21/486; H01L 21/76816; G06F 3/0412
See application file for complete search history.

(56) References Cited

U.S. PATENT DOCUMENTS

| 6,590,165 B1 * | 7/2003 | Takada ................. H05K 3/0035 174/266 |
| 2009/0029506 A1 | 1/2009 | Fujii et al. |

(Continued)

FOREIGN PATENT DOCUMENTS

TW 200834869 A 8/2008

OTHER PUBLICATIONS

International search report of PCT application No. PCT/CN2019/125656 dated Mar. 18, 2020.
(Continued)

*Primary Examiner* — Victor A Mandala
*Assistant Examiner* — Colleen E Snow
(74) *Attorney, Agent, or Firm* — Fay Sharpe LLP (57) ABSTRACT

A via hole structure includes: a first conductive layer, an interlayer insulating layer, and a second conductive layer that are sequentially arranged, wherein the interlayer insulating layer is provided with a via hole, the second conductive layer is overlapped with the first conductive layer by the via hole, and at least part of a surface, in contact with the second conductive layer, of the interlayer insulating layer is uneven.

19 Claims, 4 Drawing Sheets

(51) Int. Cl.
G06F 3/041 (2006.01)
H01L 21/48 (2006.01)
H01L 21/768 (2006.01)

(56) References Cited

U.S. PATENT DOCUMENTS

| | | |
|---|---|---|
| 2012/0153463 A1 | 6/2012 | Maeda |
| 2014/0292159 A1 | 10/2014 | Takemura et al. |
| 2018/0052552 A1* | 2/2018 | Tsai ................ H01L 27/323 |
| 2018/0096941 A1 | 4/2018 | Kim et al. |
| 2018/0217430 A1* | 8/2018 | Ding ................ H01L 27/1214 |
| 2018/0286782 A1* | 10/2018 | Noda ................ H01L 23/481 |
| 2018/0356664 A1* | 12/2018 | Yang ................ H01L 29/66757 |
| 2020/0144313 A1 | 5/2020 | Zhang et al. |

OTHER PUBLICATIONS

First office action of Chinese application No. 201910098927.6 dated Apr. 2, 2020.

* cited by examiner

VIA HOLE STRUCTURE, MANUFACTURING METHOD THEREOF, ELECTRONIC DEVICE, AND DISPLAY DEVICE

CROSS-REFERENCE TO RELATED APPLICATION

The present disclosure is a 371 of PCT Application No. PCT/CN2019/125656, filed on Dec. 16, 2019, and claims priority to Chinese Patent Application No. 201910098927.6, filed on Jan. 31, 2019 and entitled "VIA HOLE STRUCTURE, MANUFACTURING METHOD OF VIA HOLE STRUCTURE, ELECTRONIC DEVICE, AND DISPLAY DEVICE", the entire contents of which are incorporated herein by reference.

TECHNICAL FIELD

The present disclosure relates to the technical field of electronics, and in particular, relates to a via hole structure and a manufacturing method thereof, an electronic device, and a display device.

BACKGROUND

The display device, such as a touch screen or a display screen, usually includes a via hole structure. The conventional via hole structure includes a first conductive layer, an interlayer insulating layer, and a second conductive layer that are sequentially arranged. The interlayer insulating layer is provided with a via hole, and the second conductive layer is overlapped with the first conductive layer by the via hole.

SUMMARY

Embodiments of the present disclosure provide a via hole structure and a manufacturing method thereof, an electronic device, and a display device.

In one aspect, a via hole structure is provided. The via hole structure includes:

a first conductive layer, an interlayer insulating layer, and a second conductive layer that are sequentially arranged, wherein the interlayer insulating layer is provided with a via hole, the second conductive layer is overlapped with the first conductive layer by the via hole, and at least part of a surface, in contact with the second conductive layer, of the interlayer insulating layer is uneven.

Optionally, an inner wall surface of the via hole is uneven.

Optionally, a surface, distal from the first conductive layer, of the interlayer insulating layer is uneven.

Optionally, the uneven surface has a roughness in a value range of 0.05 d≤r≤0.15 d, where r represents the roughness, and d represents a thickness of the interlayer insulating layer.

Optionally, r=0.05 d, r=0.1 d, or r=0.15 d.

Optionally, at least one of the first conductive layer and the second conductive layer is made of metal.

Optionally, the first conductive layer includes a common electrode line, and the second conductive layer includes a common electrode; or the first conductive layer includes a drain of a thin film transistor, and the second conductive layer includes a pixel electrode; or the first conductive layer includes a touch sensing trace, and the second conductive layer includes a touch sensing electrode; or the first conductive layer includes a transverse metal strip, and the second conductive layer includes a longitudinal metal strip.

In another aspect, a manufacturing method of a via hole structure is provided. The method includes:

forming a first conductive layer and an initial insulating layer sequentially;

obtaining an interlayer insulating layer by forming a via hole on the initial insulating layer; and forming a second conductive layer on the interlayer insulating layer, wherein the second conductive layer is overlapped with the first conductive layer by the via hole, and at least part of a surface, in contact with the second conductive layer, of the interlayer insulating layer is uneven.

Optionally, obtaining the interlayer insulating layer by forming the via hole on the initial insulating layer includes:

forming a mask pattern layer on the initial insulating layer, wherein the mask pattern layer is provided with an opening region;

obtaining the interlayer insulating layer by forming the via hole on a region, corresponding to the opening region, of the initial insulating layer; and roughening the at least part of the surface, in contact with the second conductive layer, of the interlayer insulating layer.

Optionally, roughening the at least part of the surface, in contact with the second conductive layer, of the interlayer insulating layer includes:

roughening an inner wall surface of the via hole with the mask pattern layer covered; and stripping the mask pattern layer.

Optionally, roughening the at least part of the surface, in contact with the second conductive layer, of the interlayer insulating layer includes:

stripping the mask pattern layer; and roughening an inner wall surface of the via hole and a surface, distal from the first conductive layer, of the interlayer insulating layer.

Optionally, the roughening the at least part of the surface, in contact with the second conductive layer, of the interlayer insulating layer includes: roughening the at least part of the surface, in contact with the second conductive layer, of the interlayer insulating layer by bombardment with plasma.

Optionally, the plasma includes a gas that does not react with the initial insulating layer.

Optionally, the plasma includes at least one of helium, argon and oxygen.

In still another aspect, an electronic device is provided. The electronic device includes the via hole structure as described above.

In one aspect, a display device is provided. The display device includes the electronic device as described above.

It is to be understood that both the foregoing general description and the following detailed description are exemplary only and are not intended to limit the present disclosure.

DETAILED DESCRIPTION

For clearer descriptions of the objects, technical solutions and advantages of the present disclosure, implementations of the present disclosure will be described in further detail below with reference to the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

The display device usually includes a via hole structure, and the via hole structure usually includes a first conductive layer, an interlayer insulating layer, and a second conductive layer that are sequentially arranged. The interlayer insulating layer is provided with a via hole, and the second conductive layer is overlapped with the first conductive layer by the via hole. In a conventional via hole structure, a surface, distal from the first conductive layer, of the interlayer insulating layer is smooth, and the inner wall surface of the via hole is smooth. In this way, parts of the second conductive layer in the via hole and on the interlayer insulating layer are prone to falling off, thereby resulting in poor overlap between the second conductive layer and the first conductive layer.

To prevent the second conductive layer from falling off, the slop angle (which refers to the included angle between the inner wall surface of the via hole and a surface of the first conductive layer proximal to the interlayer insulating layer) of the via hole is mainly corrected by changing etching parameters of an etching process during the formation of the via hole by the etching process. However, due to limitation of the etching process, the etching parameters need to be frequently adjusted to correct the slope angle of the via hole, which is difficult to realize. At the same time, when correcting the slope angle of the via hole, if the interlayer insulating layer is non-uniform film layer, the correction effect to be intended cannot be achieved. Therefore, the requirement on the film forming uniformity of the interlayer insulating layer is high.

The present disclosure provides a via hole structure and a manufacturing method of the via hole, an electronic device, and a display device. In the via hole structure, the interlayer insulating layer is provided with a via hole, and at least part of a surface, in contact with the second conductive layer, of the interlayer insulating layer is uneven. Therefore, the adhesive force between the second conductive layer and the interlayer insulating layer is great, such that the second conductive layer is prevented from falling off, thereby avoiding poor overlap between the second conductive layer and the first conductive layer. In addition, in the solution according to the embodiments of the present disclosure, the slope angle of the via hole is not required to be corrected by changing the etching parameters. In this way, the implementation is simplified, and the requirement on the film forming uniformity of the interlayer insulating layer is lowered. For a detailed solution of the present disclosure, reference may be made to description of the following embodiments.

In the following, the at least part of the surface (that is, the foregoing uneven surface), in contact with the second conductive layer, of the interlayer insulating layer is described below with reference to the drawings.

Figure 1:
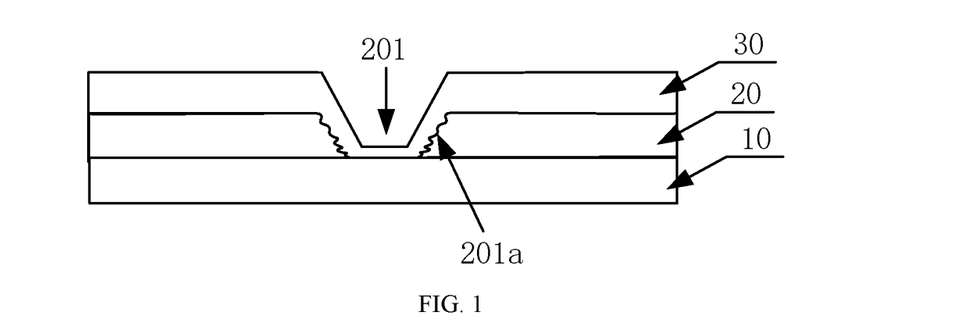
FIG. 1 is a schematic structural diagram of a via hole structure according to an embodiment of the present disclosure.

Referring to FIG. 1, a schematic structural diagram showing a via hole structure according to an embodiment of the present disclosure is given. The via hole structure includes a first conductive layer 10, an interlayer insulating layer 20, and a second conductive layer 30 that are sequentially arranged. The interlayer insulating layer 20 is provided with a via hole 201. An inner wall surface 201a (that is, the inside surface of the via hole) of the via hole 201 is uneven. The second conductive layer 30 is overlapped with the first conductive layer 10 by the via hole 201.

To sum up, in the via hole structure according to the embodiments of the present invention, as the inner wall surface of the via hole is uneven, the adhesive force between the part of the second conductive layer in the via hole and the inner wall surface of the via hole is increased, such that the part of the second conductive layer in the via hole is prevented from falling off, thereby avoiding poor overlap between the second conductive layer and the first conductive layer, and improving the effect of overlapping between the second conductive layer and the first conductive layer.

Figure 2:
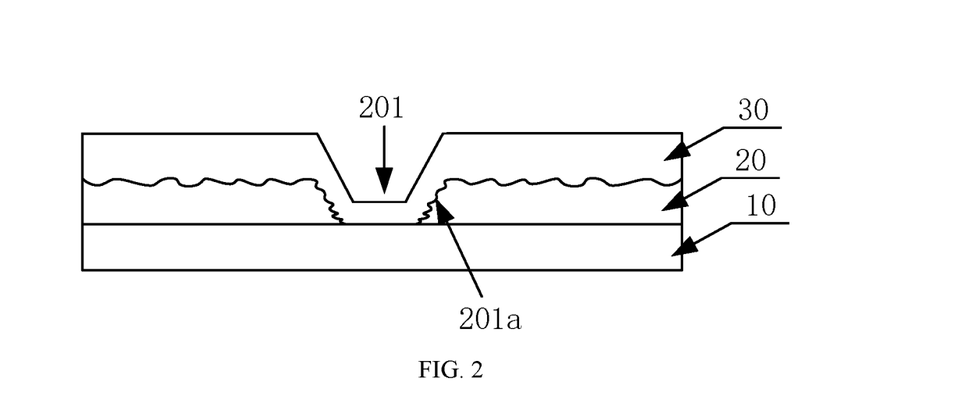
FIG. 2 is a schematic structural diagram of another via hole structure according to an embodiment of the present disclosure.

Optionally, FIG. 2 is a schematic structural diagram showing another via hole structure according to an embodiment of the present disclosure. A surface, distal from the first conductive layer 10, of the interlayer insulating layer 20 is uneven. The via hole structure has a via region and a non-via region. The via region refers to a region where the via hole 201 of the interlayer insulating layer 20 is located (that is, a region of the via hole structure corresponding to the via hole of the interlayer insulating layer 20). The non-via region refers to a region of the via hole structure other than the via region. That the surface, distal from the first conductive layer 10, of the interlayer insulating layer 20 is the uneven surface refers to that a surface, distal from the first conductive layer 10, of the interlayer insulating layer 20 in the non-via region is the uneven surface. In this way, as in the non-via region of the via hole structure, the surface, distal from the first conductive layer 10, of the interlayer insulating layer 20 is the uneven surface, the adhesive force between the interlayer insulating layer 20 and the second conductive layer 30 in the non-via region of the via hole structure is increased, thereby improving the effect of overlapping between the interlayer insulating film layer 20 and the second conductive layer 30.

Optionally, both the inner wall surface 201a of the via hole 201 and the surface, distal from the first conductive layer 10, of the interlayer insulating layer 20 may be provided with uneven micro structures (not shown in FIG. 1 and FIG. 2, which may be, for example, microgroove), so that both the inner wall surface 201a of the via hole 201 and the surface, distal from the first conductive layer 10, of the interlayer insulating layer 20 are uneven surfaces, that is, both the inner wall surface 201a of the via hole 201 and the surface, distal from the first conductive layer 10, of the interlayer insulating layer 20 have a certain roughness. Optionally, both the roughness of the surface, distal from the first conductive layer 10, of the interlayer insulating layer 20 and the inner wall surface of the via hole have a value range of $0.05\ d \leq r \leq 0.15\ d$, where r represents the roughness, and d represents the thickness of the interlayer insulating layer 20. Exemplarily r=0.05d, r=0.1d, or r=0.15d.

Optionally, at least one of the first conductive layer 10 and the second conductive layer 30 is made of metal. The interlayer insulating layer 20 may be made of silicon nitride, silicon oxide, silicon oxynitride, or the like. Further, the interlayer insulating layer 20 may be one insulating film layer, or an insulating layer formed by stacking a plurality of insulating film layers, which is not limited in the embodiments of the present disclosure.

It should be noted that the structures shown in FIG. 1 and FIG. 2 are only examples. In other implementations, only the surface, distal from the first conductive layer 10, of the interlayer insulating layer 20 may be the uneven surface. Furthermore, in addition to that the entire surface of the inner wall surface 201a of the via hole 201 or the entire surface, distal from the first conductive layer 10, of the interlayer insulating layer 20 is the uneven surface, only the part of the surface of the inner wall surface 201a of the via hole 201 or the part of the surface, distal from the first conductive layer 10, of the interlayer insulating layer 20 may be the uneven surface.

It should be noted that the via hole structure according to the embodiments of the present disclosure may be any via hole structure that includes two conductive layers and an insulating layer located between the two conductive layers, and the two conductive layers overlapping by a via hole on the insulating layer. In different products, the two conductive layers in the via hole structure have different embodiments. For example, in a display screen, the insulating layer is disposed between a common electrode and a common electrode line. The insulating layer is provided with the via hole, and the common electrode is overlapped with the common electrode line by the via hole. Therefore, the common electrode, the common electrode line and the insulating layer constitutes the via hole structure. For another example, in a display substrate, the insulating layer is disposed between a pixel electrode and a drain of a thin film transistor (TFT). The insulating layer is provided with the via hole, and the pixel electrode is overlapped with the drain of the thin film transistor by the via hole. Therefore, the pixel electrode, the drain of the thin film transistor, and the insulating layer constitute the via hole structure. For still another example, in a touch screen, the insulating layer is disposed between a touch sensing trace and a touch sensing electrode. The insulating layer is provided with the via hole, and the touch sensing trace is overlapped with the touch sensing electrode by the via hole. Therefore, the touch sensing trace, the touch sensing electrode, and the insulating layer constitute the via hole structure. For still another example, in a touch panel, the insulating layer is disposed between a transverse metal strip and a longitudinal metal strip. The insulating layer is provided with the via hole, and the transverse metal strip is overlapped with the longitudinal metal strip by the via hole. Therefore, the transverse metal strip, the longitudinal metal strip, and the insulating layer constitute the via hole structure. For yet still another example, in a substrate circuit, the insulating layer is disposed between two transmission lines. The insulating layer is provided with the via hole, and the two transmission lines overlap by the via hole. Therefore, the two transmission lines and the insulating layer constitutes the via hole structure. It should be noted that the via hole structures illustrated herein are merely exemplary and are not intended to limit the solution of the embodiments of the present disclosure. A person skilled in the art should understand that any structure in which two conductive layers overlap by the via hole on the insulating layer between the two conductive layers falls within the scope of the embodiments of the present disclosure, which is not described in detail herein.

To sum up, in the via hole structure according to the embodiments of the present invention, as the inner wall surface of the via hole is uneven, the adhesive force between the part of the second conductive layer in the via hole and the inner wall surface of the via hole is increased, such that the part of the second conductive layer in the via hole is prevented from falling off, thereby avoiding poor overlap between the second conductive layer and the first conductive layer, and improving the effect of overlapping between the second conductive layer and the first conductive layer. In the solution according to the embodiments of the present disclosure, the slope angle of the via hole is not required to be corrected by changing the etching parameters. In this way, the implementation is simplified, and the requirement on the film forming uniformity of the interlayer insulating layer is lowered.

The via hole structure according to the embodiments of the present disclosure is applicable to the following method. For the manufacturing method of the via hole structure and the manufacturing principle of the via hole structure of the embodiments of the present disclosure, reference may be made to the description in the following embodiments.

Figure 3:
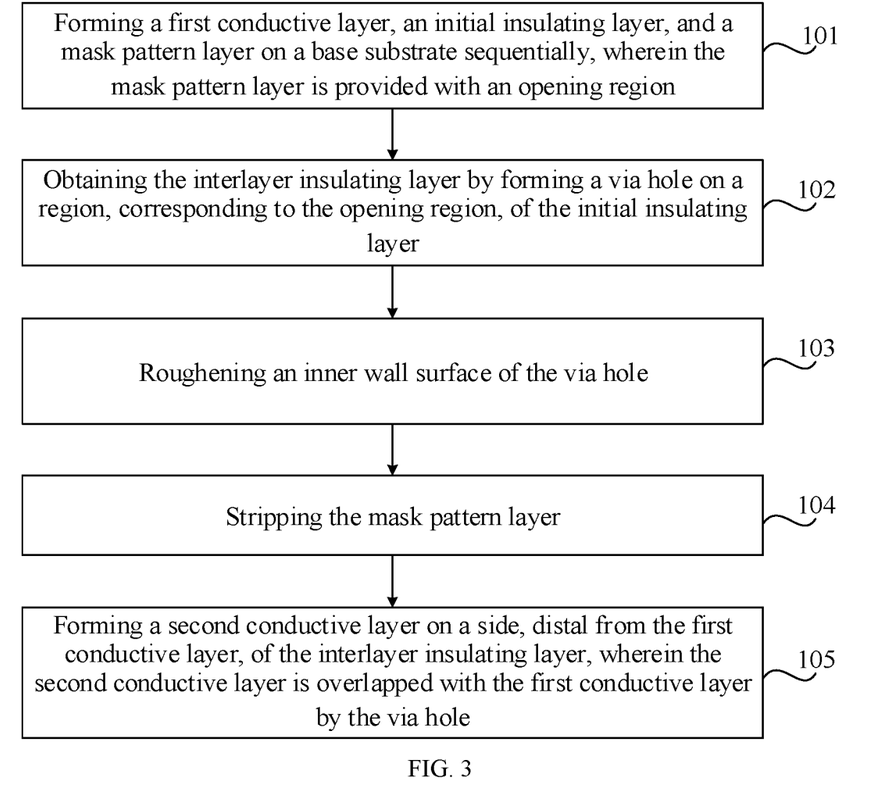
FIG. 3 is a flowchart of a manufacturing method of a via hole structure according to an embodiment of the present disclosure.

Referring to FIG. 3, a flowchart showing a manufacturing method of a via hole structure according to an embodiment of the present disclosure is given. The manufacturing method of the via hole structure may be used to manufacture the via hole structure as shown in FIG. 1. The method includes the following steps.

In step 101, a first conductive layer, an initial insulating layer, and a mask pattern layer are sequentially formed on a base substrate, and the mask pattern layer is provided with an opening region.

Figure 4:
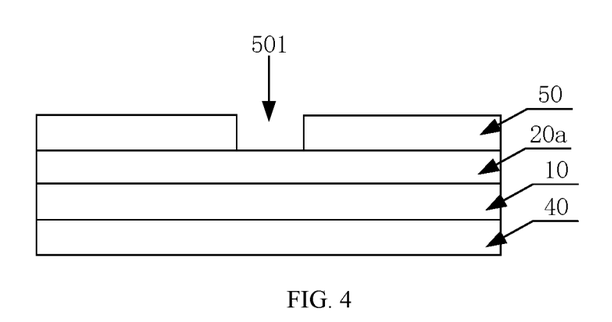
FIG. 4 is schematic diagram showing that a first conductive layer, an initial insulating layer, and a mask pattern layer have been sequentially formed on a base substrate according to an embodiment of the present disclosure.

FIG. 4 is a schematic diagram showing that a first conductive layer 10, an initial insulating layer 20a, and a mask pattern layer 50 have been sequentially formed on a base substrate 40 according to an embodiment of the present disclosure. The mask pattern layer 50 is provided with an opening region 501, and the mask pattern layer 50 may be a photoresist (PR) pattern layer. For example, forming the first conductive layer 10, the initial insulating layer 20a, and the mask pattern layer 50 sequentially on the base substrate 40 may include the following three steps.

In step (1), a conductive material layer is formed on the base substrate 40 by deposition, coating, sputtering, or the like, and then the first conductive layer 10 is obtained by processing the conductive material layer by a single patterning process.

In step (2), an initial insulating layer 20*a* is formed by deposition, coating, sputtering, or the like on the base substrate 40 on which the first conductive layer 10 has been formed.

In step (3), a PR material layer is formed by deposition, coating, sputtering, or the like on the base substrate 40 on which the initial insulating layer 20*a* has been formed, and the mask pattern layer 50 is obtained by sequentially exposing and developing the PR material layer.

In step 102, an interlayer insulating layer is obtained by formed a via hole on a region, corresponding to the opening region, of the initial insulating layer.

Figure 5:
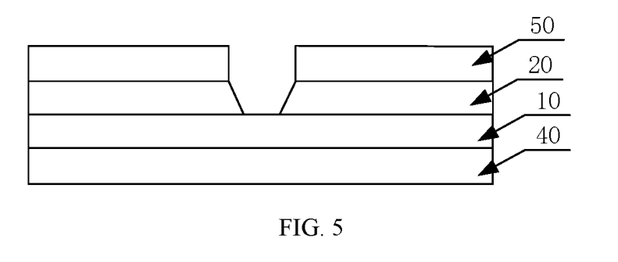
FIG. 5 is a schematic diagram showing that a via hole has been formed on a region, corresponding to an opening region of the mask pattern layer, of the initial insulating layer according to an embodiment of the present disclosure.

FIG. 5 is a schematic diagram showing that a via hole has been formed on a region, corresponding to the opening region 501 of the mask pattern layer 50, of the initial insulating layer 20*a* according to an embodiment of the present disclosure. For example, with reference to FIG. 4 and FIG. 5, the region, corresponding to the opening region 501 of the mask pattern layer 50, of the initial insulating layer 20*a* may be etched by a dry etching process, so as to form the via hole on the region, corresponding to the opening region 501, of the initial insulating layer 20*a*, thereby obtaining the interlayer insulating layer 20.

In step 103, an inner wall surface of the via hole is roughened.

Figure 6:
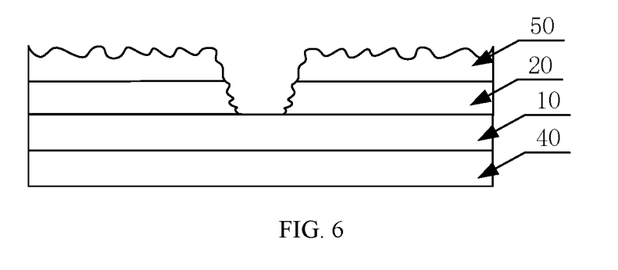
FIG. 6 is a schematic diagram showing that an inner wall surface of the via hole has been roughened according to an embodiment of the present disclosure.

FIG. 6 is a schematic diagram showing that an inner wall surface of the via hole has been roughened according to an embodiment of the present disclosure. For example, the inner wall surface of the via hole may be bombarded by preset plasma (not shown in FIG. 6) to roughen the inner wall surface of the via hole. For example, the structure shown in FIG. 5 may be disposed in a plasma etching machine, and the plasma is introduced into the plasma etching machine to bombard the inner wall surface of the via hole by the plasma, thus achieving the purpose of roughening the inner wall surface of the via hole. It should be noted that as easily understood from FIG. 6 that when bombarding the inner wall surface of the via hole, the plasma may also bombard the surface, distal from the interlayer insulating layer 20, of the mask pattern layer 50.

The bombardment is physical bombardment, and the plasma may be a gas that does not react with the initial insulating layer. For example, the plasma includes at least one of helium (He), argon (Ar), and oxygen ($O_2$), helium and argon are inert gases, and oxygen is a gas that does not react with the initial insulating layer. The plasma etching machine is a common device in the field of electronic technologies. Therefore, step 103 may be carried out in an existing device and is simple to implement. In this implementation, after the roughening treatment, the entire film layer structure may be cleaned to remove substances generated on the surface of the conductive layer by reaction between the plasma and the conductive layer.

In other implementations, the plasma may be a gas that neither reacts with the initial insulating layer nor with the conductive layer. In this way, the plasma may not react with the conductive layer, and generation of other substances on the surface of the conductive layer is avoided by the reaction.

In step 104, a mask pattern layer is stripped.

Figure 7:
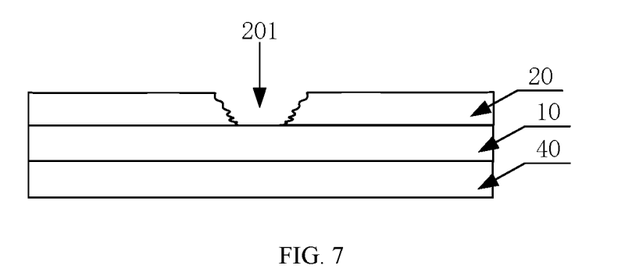
FIG. 7 is a schematic diagram showing that the mask pattern layer has been stripped according to an embodiment of the present disclosure.

FIG. 7 is a schematic structural diagram showing that a mask pattern layer 50 has been stripped according to an embodiment of the present disclosure. An interlayer insulating layer 20 is provided with a via hole 201, and an inner wall surface of the via hole 201 has uneven curves. For example, the mask pattern layer may be stripped by a stripping process, which may be an ashing process, a photoresist stripping process, or the like.

In step 105, a second conductive layer is formed on a side, distal from the first conductive layer, of the interlayer insulating layer, and the second conductive layer is overlapped with the first conductive layer by the via hole.

Figure 8:
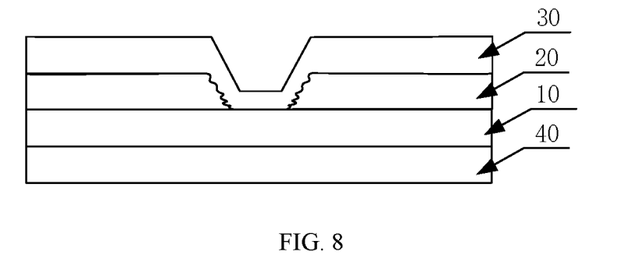
FIG. 8 is schematic diagram showing that a second conductive layer has been formed on a side, distal from the first conductive layer, of the interlayer insulating layer according to an embodiment of the present disclosure.

FIG. 8 is a schematic diagram showing that a second conductive layer 30 has been formed on a side, distal from a first conductive layer 10, of an interlayer insulating layer 20 according to an embodiment of the present disclosure, where the first conductive layer 10, the interlayer insulating layer 20, and the second conductive layer 30 constitutes the via hole structure.

Optionally, a layer of conductive material may be deposited on the side, distal from the first conductive layer 10, of the interlayer insulating layer 20 by a physical vapor deposition (PVD) process to obtain a conductive material layer. Then, the conductive material layer is processed by a single patterning process to obtain the second conductive layer 30. With reference to FIG. 7, during the process of depositing the conductive material on the side, distal from the first conductive layer 10, of the interlayer insulating layer 20 by the PVD process, the conductive material may also be deposited within the via hole 201 of the interlayer insulating layer 20, resulting in that the part of the finally-manufactured second conductive layer 30 in the via hole 201 contacts with the first conductive layer 10. In this way, the second conductive layer 30 is overlapped with the first conductive layer 10 by the via hole 201.

In the embodiments of the present invention, the inner wall surface of the via hole is roughened after the via hole is formed on the interlayer insulating layer, so that the inner wall surface of the via hole is rough. When the second conductive layer is deposited, the conductive material is prone to being deposited within the via hole. In this way, the part of the second conductive layer in the via hole is prevented from falling off, thereby avoiding a fault of the second conductive layer, and improving the effect of overlapping between the second conductive layer and the first conductive layer.

To sum up, in the manufacturing method of the via hole structure according to the embodiments of the present invention, as the inner wall surface of the via hole is roughened, the adhesive force between the part of the second conductive layer in the via hole and the inner wall surface of the via hole is increased, such that the part of the second conductive layer in the via hole is prevented from falling off, thereby avoiding poor overlap between the second conductive layer and the first conductive layer, and improving the effect of overlapping between the second conductive layer and the first conductive layer. In the solution according to the embodiments of the present disclosure, the slope angle of the via hole is not required to be corrected by changing the etching parameters. In this way, the implementation is simplified, and the requirement on the film forming uniformity of the interlayer insulating layer is lowered.

Figure 9:
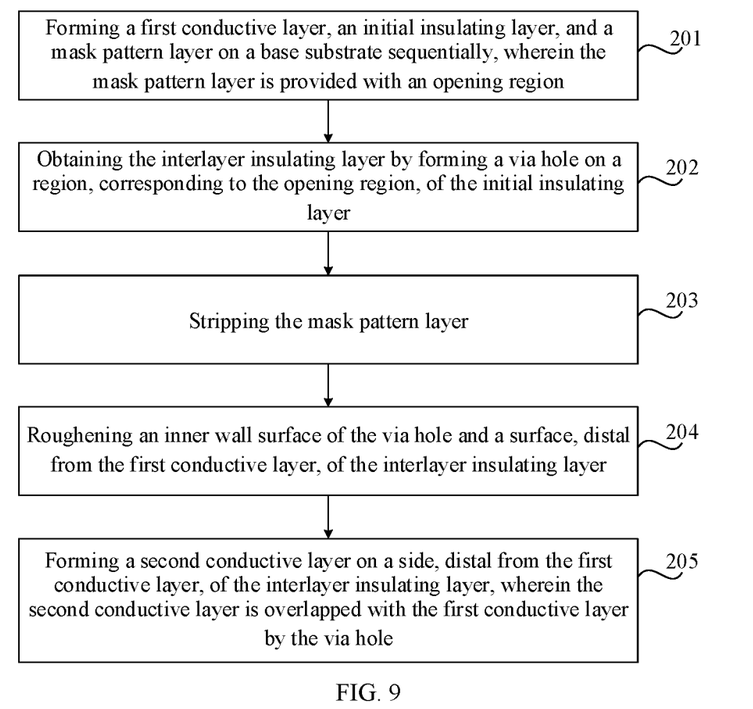
FIG. 9 is a flowchart of a manufacturing method of another via hole structure according to an embodiment of the present disclosure.

Referring to FIG. 9, another flowchart of a manufacturing method of a via hole structure according to an embodiment of the present disclosure is given. The manufacturing method of the via hole structure is applicable to manufacturing of the via hole structure as shown in FIG. 2. The method includes the following steps.

In step 201, a first conductive layer, an initial insulating layer, and a mask pattern layer are sequentially formed on a base substrate, and the mask pattern layer is provided with an opening region.

In step 202, an interlayer insulating layer is obtained by formed a via hole on a region, corresponding to the opening region, of the initial insulating layer.

For the implementation process of step 201 and step 202, reference may be made to step 101 and step 102 in the embodiment shown in FIG. 3, which is not repeated in the embodiment of the present disclosure.

In step 203, a mask pattern layer is stripped.

Figure 10:
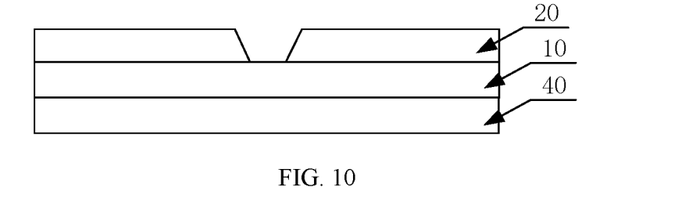
FIG. 10 is a schematic diagram showing that the mask pattern layer on an interlayer insulating layer has been stripped according to an embodiment of the present disclosure.

For example, FIG. 10 is a schematic diagram showing that a mask pattern layer on an interlayer insulating layer has been stripped according to an embodiment of the present disclosure. For the implementation process of step 203, reference may be made to step 104 in the embodiment shown in FIG. 3, which is not repeated in the embodiment of the present disclosure.

In step 204, an inner wall surface of the via hole and a surface, distal from the first conductive layer, of the interlayer insulating layer are roughened.

Figure 11:
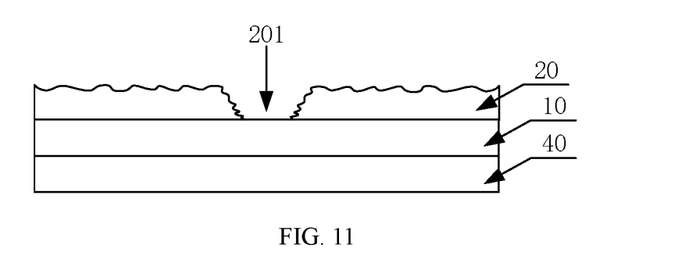
FIG. 11 is a schematic diagram showing that an inner wall surface of the via hole and a surface, distal from the first conductive layer, of the interlayer insulating layer have been roughened according to an embodiment of the present disclosure.

For example, FIG. 11 is a schematic diagram showing that an inner wall surface of a via hole 201 and a surface, distal from a first conductive layer 10, of an interlayer insulating layer 20 has been roughened according to an embodiment of the present disclosure. For the implementation process of step 204, reference may be made to step 103 in the embodiment shown in FIG. 3, which is not repeated in the embodiment of the present disclosure. However, it should be noted that, in the present embodiments, as the mask pattern layer on the interlayer insulating layer 20 has been stripped in step 203, when bombardment with plasma is used, the inner wall surface of the via hole 201 may be bombarded, and the surface, distal from the first conductive layer 10, of the interlayer insulating layer 20 may also be bombarded. In this way, both the inner wall surface of the via hole 201 and the surface, distal from the first conductive layer 10, of the interlayer insulating layer 20 are uneven surfaces as shown in FIG. 11.

In step 205, a second conductive layer is formed on a side, distal from the first conductive layer, of the interlayer insulating layer, and the second conductive layer is overlapped with the first conductive layer by the via hole.

For the implementation process of step 205, reference may be made to step 105 in the embodiment shown in FIG. 3, which is not repeated in the embodiment of the present disclosure. However, it should be noted that as both the inner wall surface of the via hole and the surface, distal from the first conductive layer 10, of the interlayer insulating layer 20 are roughened in step 204, both the inner wall surface of the via hole and the surface, distal from the first conductive layer 10, of the interlayer insulating layer 20 are the uneven surfaces. In this way, the adhesive force between the second conductive layer and the inner wall surface of the via hole 201, and the adhesive force between the second conductive layer and the interlayer insulating layer 20 may be increased, thereby preventing the second conductive layer from falling off, and improving the effect of overlapping between the second conductive layer and the first conductive layer.

To sum up, in the manufacturing method of the via hole structure according to the embodiments of the present invention, as both the inner wall surface of the via hole and the surface, distal from the first conductive layer, of the interlayer insulating layer are roughed, both the adhesive force between the part of the second conductive layer in the via hole and the inner wall surface of the via hole, and the adhesive force between the second conductive layer and the interlayer insulating layer are increased, such that the second conductive layer is prevented from falling off, thereby avoiding poor overlap between the second conductive layer and the first conductive layer, and improving the effect of overlapping between the second conductive layer and the first conductive layer. In the solution according to the embodiments of the present disclosure, the slop angle of the via hole is not required to be corrected by changing the etching parameters. In this way, the implementation is simplified, and the requirement on the film forming uniformity of the interlayer insulating layer is lowered.

It should be noted that in the manufacturing method of the via hole structure according to the embodiments of the present invention, the single patterning process as involved may include photoresist coating, exposure, development, etching, and photoresist stripping. Processing the material layer by the single patterning process to obtain the corresponding structure (such as processing the conductive material layer to obtain the first conductive layer) may include: firstly, coating a material layer (such as a conductive material layer) with a layer of photoresist to form a photoresist layer; next, exposing the photoresist layer by a mask, such that the photoresist layer forms a completely-exposed region and a non-exposed region; subsequently, removing the photoresist in the completely-exposed region completely and retaining all the photoresist in the non-exposed region by a developing process; hereafter, etching a region corresponding to the completely-exposed region of the material layer (such as the conductive material layer) by an etching process; and finally stripping the photoresist in the non-exposed region to obtain the corresponding structure (such as the first conductive layer). Here, the description is given by taking the photoresist being a positive photoresist as an example. When the photoresist is a negative photoresist, for the practice of the single patterning process, reference may be the description in this paragraph and is not repeated in the embodiment of the present disclosure here.

It should be further noted that the sequence of the steps in the manufacturing method of the via hole structure according to the embodiments of the present disclosure may be appropriately adjusted, and the steps may also be added or omitted according to specific situation. Within the technical scope disclosed by the present disclosure, any variant which may be easily envisaged by those skilled in the art shall fall within the protection scope of the present disclosure, and therefore is not repeated here.

The embodiments of the present disclosure further provide an electronic device. The electronic device includes the via hole structure as shown in FIG. 1 or FIG. 2.

The embodiments of the present disclosure further provide a display device, including an electronic device. The electronic device includes the via hole structure as shown in FIG. 1 or FIG. 2. The display device may be a touch screen, a thin film transistor liquid crystal display (TFT-LCD), an organic light-emitting diode (OLED) display, a mobile phone, a tablet computer, a television, a notebook computer, a digital photo frame, or a navigator product or component.

Other embodiments of the present disclosure will be apparent to those skilled in the art from consideration of the specification and practice of the present disclosure. This application is intended to cover any variations, uses, or adaptations of the present disclosure, the variations, uses, or adaptations follow the general principles of the present disclosure and include common knowledge or common-used technical measures which are not disclosed herein. The specification and embodiments are to be considered as exemplary only, and the true scope and spirit of the present disclosure are indicated by the following claims.

It would be appreciated that the present disclosure is not limited to the exact structure that has been described above and illustrated in the accompanying drawings, and various modifications and changes may be made without departing from the scope of the present disclosure. It is intended that the scope of the present disclosure is only subject to the appended claims.

What is claimed is:

1. A via hole structure, comprising:
a first conductive layer, an interlayer insulating layer, and a second conductive layer that are sequentially arranged, wherein the interlayer insulating layer is provided with a via hole, the second conductive layer is overlapped with the first conductive layer by the via hole, and at least part of a surface, in contact with the second conductive layer, of the interlayer insulating layer is uneven;
wherein the uneven surface has a roughness in a value range of 0.05 d≤r≤0.15 d, where r represents the roughness, and d represents a thickness of the interlayer insulating layer.

2. The via hole structure according to claim 1, wherein an inner wall surface of the via hole is uneven.

3. The via hole structure according to claim 2, wherein a surface, distal from the first conductive layer, of the interlayer insulating layer is uneven.

4. The via hole structure according to claim 1, wherein a surface, distal from the first conductive layer, of the interlayer insulating layer is uneven.

5. The via hole structure according to claim 1, wherein r=0.05 d.

6. The via hole structure according to claim 1, wherein at least one of the first conductive layer and the second conductive layer is made of metal.

7. The via hole structure according to claim 1, wherein the first conductive layer comprises a common electrode line, and the second conductive layer comprises a common electrode.

8. The via hole structure according to claim 1, wherein r=0.1 d.

9. The via hole structure according to claim 1, wherein r=0.15 d.

10. The via hole structure according to claim 1, wherein the first conductive layer comprises a drain of a thin film transistor, and the second conductive layer comprises a pixel electrode.

11. The via hole structure according to claim 1, wherein the first conductive layer comprises a touch sensing trace, and the second conductive layer comprises a touch sensing electrode.

12. The via hole structure according to claim 1, wherein the first conductive layer comprises a transverse metal strip, and the second conductive layer comprises a longitudinal metal strip.

13. A manufacturing method of a via hole structure, comprising:
forming a first conductive layer and an initial insulating layer sequentially;
obtaining an interlayer insulating layer by forming a via hole on the initial insulating layer; and
forming a second conductive layer on the interlayer insulating layer, wherein the second conductive layer is overlapped with the first conductive layer by the via hole, and at least part of a surface, in contact with the second conductive layer, of the interlayer insulating layer is uneven;
wherein the uneven surface has a roughness in a value range of 0.05 d≤r≤0.15 d, where r represents the roughness, and d represents a thickness of the interlayer insulating layer.

14. The method according to claim 13, wherein obtaining the interlayer insulating layer by forming the via hole on the initial insulating layer comprises:
forming a mask pattern layer on the initial insulating layer, wherein the mask pattern layer is provided with an opening region;
obtaining the interlayer insulating layer by forming the via hole on a region, corresponding to the opening region, of the initial insulating layer; and
roughening the at least part of the surface, in contact with the second conductive layer, of the interlayer insulating layer.

15. The method according to claim 14, wherein roughening the at least part of the surface, in contact with the second conductive layer, of the interlayer insulating layer comprises one of followings:
roughening an inner wall surface of the via hole with the mask pattern layer covered; and stripping the mask pattern layer;
stripping the mask pattern layer; and roughening an inner wall surface of the via hole and a surface, distal from the first conductive layer, of the interlayer insulating layer; and
roughening the at least part of the surface, in contact with the second conductive layer, of the interlayer insulating layer by bombardment with plasma.

16. The method according to claim 15, wherein the plasma comprises a gas that does not react with the initial insulating layer.

17. The method according to claim 16, wherein the plasma comprises at least one of helium, argon and oxygen.

18. An electronic device, comprising a via hole structure, wherein the via hole structure comprises:
a first conductive layer, an interlayer insulating layer, and a second conductive layer that are sequentially arranged, wherein the interlayer insulating layer is provided with a via hole, the second conductive layer is overlapped with the first conductive layer by the via hole, and at least part of a surface, in contact with the second conductive layer, of the interlayer insulating layer is uneven;
wherein the uneven surface has a roughness in a value range of 0.05 d≤r≤0.15 d, where r represents the roughness, and d represents a thickness of the interlayer insulating layer.

19. A display device, comprising the electronic device as defined in claim 18.

* * * * *